US010043787B2

(12) United States Patent
Tokunari

(10) Patent No.: US 10,043,787 B2
(45) Date of Patent: Aug. 7, 2018

(54) OPTOELECTRONIC CHIP EMBEDDED ORGANIC SUBSTRATE

(71) Applicant: INTERNATIONAL BUSINESS MACHINES CORPORATION, Armonk, NY (US)

(72) Inventor: Masao Tokunari, Kawasaki (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/402,705

(22) Filed: Jan. 10, 2017

(65) Prior Publication Data

US 2018/0197842 A1 Jul. 12, 2018

(51) Int. Cl.

| | |
|---|---|
| ***H01L 25/16*** | (2006.01) |
| ***H01S 5/183*** | (2006.01) |
| ***H01S 5/022*** | (2006.01) |
| ***H01L 31/02*** | (2006.01) |
| ***H01L 31/0232*** | (2014.01) |
| ***H01S 5/00*** | (2006.01) |

(52) U.S. Cl.

CPC ...... *H01L 25/167* (2013.01); *H01L 31/02002* (2013.01); *H01L 31/02325* (2013.01); *H01S 5/005* (2013.01); *H01S 5/02252* (2013.01); *H01S 5/02268* (2013.01); *H01S 5/183* (2013.01)

(58) Field of Classification Search

CPC ............. H01L 25/167; H01L 31/02002; H01L 31/02325; H01S 5/02252; H01S 5/183; H01S 5/02268; H01S 5/005

See application file for complete search history.

(56) References Cited

U.S. PATENT DOCUMENTS 7,306,959 B2 12/2007 Liu
2002/0110952 A1* 8/2002 Gris ........................ H01L 24/24 438/106
2006/0219862 A1* 10/2006 Ho .................... H01L 27/14618 250/208.1
2011/0007998 A1 1/2011 Yamamoto et al.
2012/0037935 A1* 2/2012 Yang ................... H01L 31/0203 257/98
2012/0273959 A1* 11/2012 Park ........................ H01L 24/97 257/774
2014/0002700 A1* 1/2014 Oishi ..................... H04N 5/369 348/273
2015/0138656 A1* 5/2015 Ahn ..................... H05K 1/0274 359/811
2015/0271923 A1* 9/2015 Shimabe ................ H05K 1/185 174/251
2015/0373238 A1* 12/2015 Tago .................... H04N 5/2257 348/374
2016/0223749 A1 8/2016 Coolbaugh et al.
2017/0097480 A1* 4/2017 Wang ................... G02B 6/4238

* cited by examiner

*Primary Examiner* — Steven Loke
*Assistant Examiner* — Juanita Rhodes
(74) *Attorney, Agent, or Firm* — Tutunjian & Bitetto, P.C.; Vazken Alexanian

(57) ABSTRACT

Optoelectronic devices and method of forming the same include an optoelectronic chip in a substrate layer, the optoelectronic chip having one or more optoelectronic components. An integrated circuit chip is positioned on the substrate layer. A lens array is positioned on the substrate layer above the optoelectronic chip and above at least part of the integrated circuit chip. The lens array includes one or more lens positioned directly respective optoelectronic components.

19 Claims, 9 Drawing Sheets

100 108 116 112 114 110 109 106 104 102

OPTOELECTRONIC CHIP EMBEDDED ORGANIC SUBSTRATE

BACKGROUND

Technical Field

The present invention generally relates to optical interconnects and, more particularly, to embedding optoelectronic chips in a substrate.

Description of the Related Art

In optical multi-chip modules, optoelectronic (OE) chips such as a vertical-cavity surface emitting laser or a photodetector are optically coupled with waveguides, lens array connectors, and with optical fibers using 45-degree mirrors formed on or in the waveguides themselves.

However, significant coupling loss occurs at the coupling between OE chips and waveguides and between waveguides and fibers. The coupling loss is usually caused by differences in core size and numerical aperture and by the distance between the components. As the need for high bandwidth densities in chip-to-chip interconnection increase, the loss budget becomes more strict due to a decrease in the photodetector active area and a deterioration of receiver sensitivity.

SUMMARY

An optoelectronic device includes an optoelectronic chip in a substrate layer, the optoelectronic chip having one or more optoelectronic components. An integrated circuit chip is positioned on the substrate layer. A lens array is positioned on the substrate layer above the optoelectronic chip and above at least part of the integrated circuit chip. The lens array includes one or more lens positioned directly respective optoelectronic components.

A method of forming an optoelectronic device includes ablating material in a substrate layer to form cavities using a laser that stops on one or more conductive wire layers embedded in the substrate layer. An optoelectronic chip is positioned in one of the plurality of cavities. An integrated circuit chip is positioned on the substrate in electrical communication with the optoelectronic chip. A lens array is positioned on the substrate layer above the optoelectronic chip and above at least part of the integrated circuit chip by aligning the lens array with one or more cavities of the plurality of cavities, such that at least a portion of the lens array is positioned within the substrate layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide compact optoelectronic (OE) chip coupling by embedding the OE chip into the substrate. This enables vertical arrangement of certain components, for example by allowing a driver chip to interface directly with the OE chip and by allowing the OE chip to optically couple with a fiber without any intervening waveguides or mirrors. A cavity is provided in the substrate by, e.g., laser ablation, and a lens structure is provided that fits over the OE chip and the driver chip, conforming to the shape of the driver chip so that the driver chip can be located close to, or in contact with, the OE chip.

Figure 1:
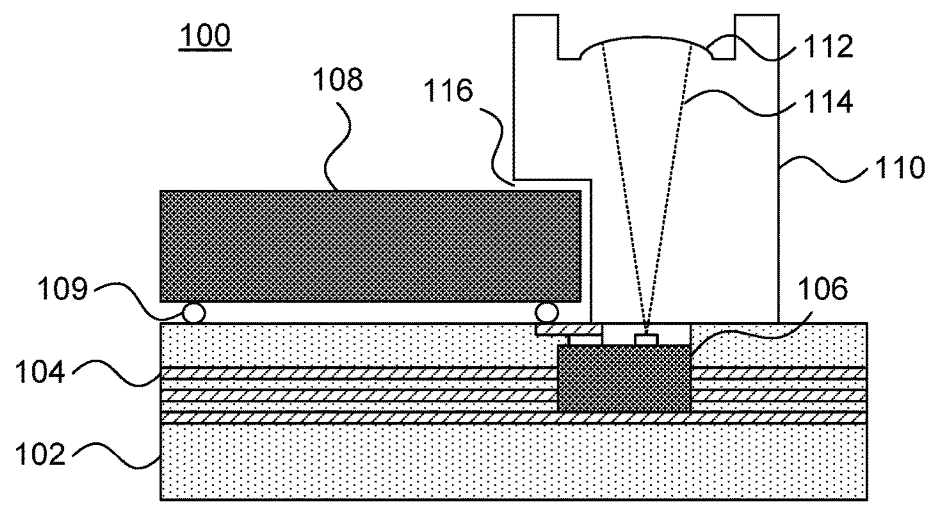
FIG. 1 is a cross-sectional diagram of an optoelectronic device in accordance with the present principles.

Referring now to the drawings in which like numerals represent the same or similar elements and initially to FIG. 1, an optical coupling system 100 is shown. The system 100 is built on a substrate 102. It is specifically contemplated that the substrate 102 may be an organic substrate formed from, e.g., a resin, but it should be understood that any appropriate substrate material may be used instead, including, e.g., a semiconductor, glass, ceramic, or dielectric material.

Embedded within the substrate 102 are a set of wiring layers 104. The wiring layers 104 define a region in the substrate for an OE chip 106 and are used, for example, to confine a laser ablation process to only the region needed for the OE chip 106. In one particular embodiment the wiring layers are formed from copper, but it should be understood that any other appropriate conductor may be used including, e.g., aluminum, silver, gold, etc. The OE chip 106 may have one or more OE components (e.g., vertical-cavity surface-emitting lasers (VCSELs) or photodetectors (PDs) formed on its surface.

Although three wiring layers 104 are shown, it should be understood that as few as two wiring layers may be used—one to define a lower boundary of the region for the OE chip 106 and one to define a perimeter of the region for the OE chip 106. However, because a typical OE chip may have a thickness of about 200 μm, while typical copper layer thickness may be about 10 μm and typical insulating layers may have a thickness of about 10 μm, there may be many such layers.

A driver chip 108 is attached to the substrate 102 by solder balls 109. The driver chip 108 may be connected to the OE chip 106 by one or more transmission lines formed in the substrate 102 or may, alternatively, be directly connected to the OE chip 106 by placing the driver chip 108 with one or more solder balls 109 in direct contact with a contact terminal of the OE chip 106. While it is specifically contemplated that the driver chip 108 has a functional relationship with the OE chip 106 to operate the one or more OE components, it should be understood that the driver chip 108 can be replaced by any appropriate chip or device that would benefit from proximity to the OE chip 106 or to the lens array 110.

A lens array 110 is positioned directly above the OE chip 106. The lens array 110 includes a set of lenses 112, with one respective lens 112 positioned directly above each respective OE component on the OE chip 106. The lens array 110 is designed such that each lens 112 covers the entire light path 114 of the respective OE component (e.g., the lens 112 collects all light emitted by a VCSEL or focuses all received light on the active area of a PD). The lens array 110 has a cut-away portion 116 that accommodates the driver chip 108. It is specifically contemplated that the lens array 110 rests entirely on the substrate 102, with the cut-away portion 116 leaving a gap between the body of the lens array 110 and the driver chip 108. This ensures alignment between the OE chip 106 and the lenses 112, as contact between the lens array 110 and the driver chip 108 might cause mispositioning errors and increase coupling losses. The dimensions of the cut-away portion 116 are determined by the geometry of the light path 114. The driver chip 108 may be moved closer to the OE chip 106 as long as the corresponding cut-away portion 116 does not interfere with the path of the light to or from the OE chip 106.

The optical coupling system 100 can be formed as an integral part of a larger optical or optoelectronic system or may, alternatively, be formed as a discrete module by encapsulating the substrate 102, driver chip 108, and lens array 110 and providing electrical interconnections on and through the substrate 102, such that the system 100 can be mounted on another structure by, e.g., solder ball connections.

In one exemplary embodiment, the OE chip 106 may have a width of about 285 μm, the wiring layers 104 may have a thickness of about 10 μm and may be positioned in the substrate 102 about 30 μm apart. The lens array 110 may have a height from the base of the lens array to a bottom level of the lenses 112 of about 527.5 μm. The driver chip may have a height of about 375 μm. The lenses 112 may have an exemplary diameter of about 250 μm.

It should be noted that the body of the lens array 110 does not act as a waveguide. As used herein, the term waveguide refers to a structure that propagates optical signals by total internal reflection. In contrast, the lens array 110 has dimensions such that the light paths 114 do not reach the lateral sides of the lens array 110 and instead pass entirely through the respective lenses 112. As such, the optoelectronic chip 106 couples to the lenses 112 the coupling losses that result from using waveguide for intra-device transmission.

Figure 2:
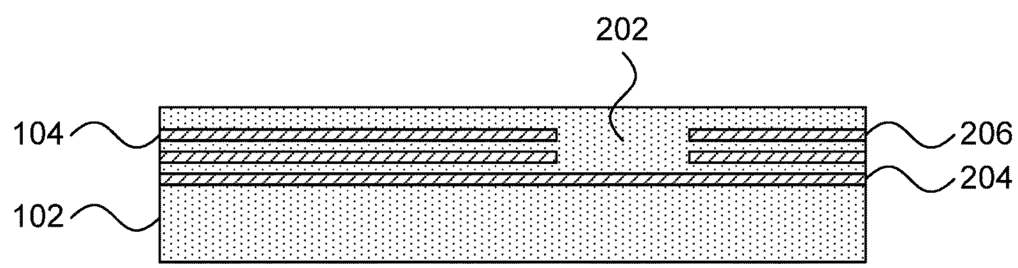
FIG. 2 is a cross-sectional diagram of a step in the formation of an optoelectronic device in accordance with the present principles.

Referring now to FIG. 2, a cross-sectional view of a step in the formation of an optical coupling system 100 is shown. The substrate 102 is formed from, e.g., an organic resin material and has wiring layers 104 embedded therein. A bottom wiring layer 204 forms a laser stop layer, while upper wiring layers 206 define areas 202 where cavities will be formed. The upper wiring layers 206 may define an entire perimeter of the areas 202 or may, alternatively, define only the corners of the areas 202.

Figure 3:
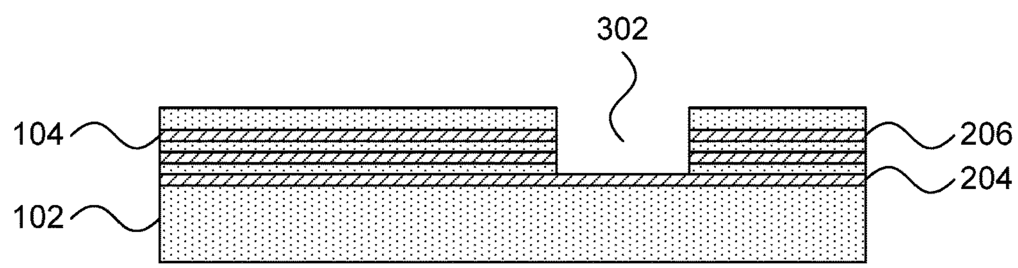
FIG. 3 is a cross-sectional diagram of a step in the formation of an optoelectronic device in accordance with the present principles.

Referring now to FIG. 3, a cross-sectional view of a step in the formation of an optical coupling system 100 is shown. A directional etch is used to remove the material from the substrate 102 in the areas 202 to form cavities 302. Cavities 302 are formed for the OE chip 106 and to create mounting points for the lens array 110.

It is specifically contemplated that laser ablation may be used to remove resin material from the substrate 102, but alternative directional etches, such as a reactive ion etch, may be used in accordance with the material of the substrate. In the example of using laser ablation, the wiring layers 104 stop the laser from removing underling material from the substrate 102. The relative position between cavities 302 can be made highly accurate, for example with hole size accuracy of about ±5 μm and positioning accuracy between the OE chip 106 and the lens array 110 of about ±5 μm.

In the case of laser ablation, it should be understood that some ablation of the wiring layers 104 may occur, but that such ablation takes place at a rate much lower than the ablation of the material of the substrate 102. In addition, although this feature is not shown, some portion of the topmost layer of the substrate 102, above the topmost wiring layer 206, will be ablated.

Figure 4:
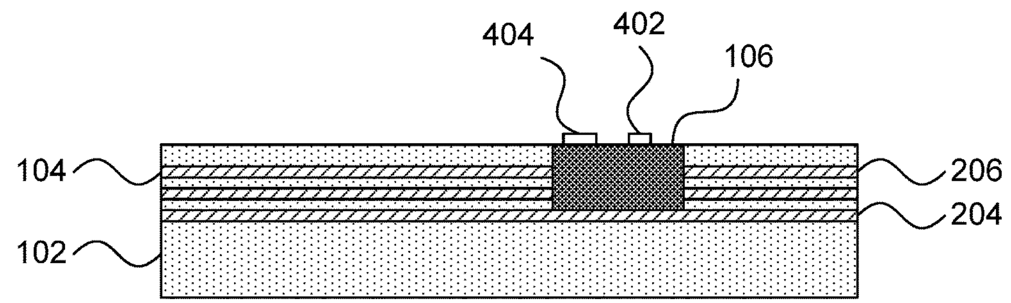
FIG. 4 is a cross-sectional diagram of a step in the formation of an optoelectronic device in accordance with the present principles.

Referring now to FIG. 4, a cross-sectional view of a step in the formation of an optical coupling system 100 is shown. The OE chip 106 is inserted in the appropriate cavity 302. The OE chip includes surface components such as the OE components 402 (e.g., VCSELs or PDs) as well as conductive terminals 404 that are used to provide communications to and from the OE chip 106.

Figure 5:
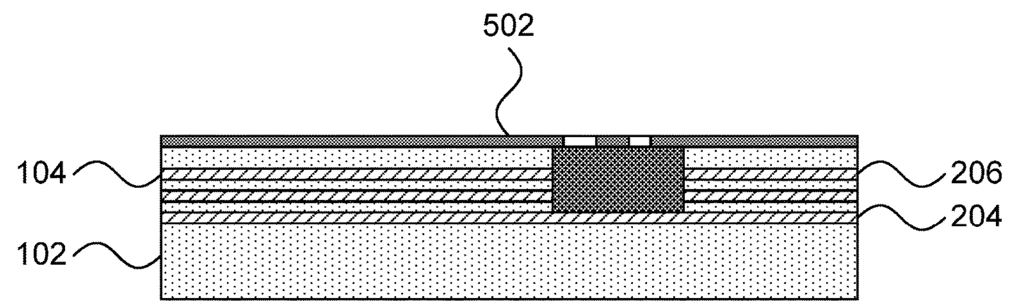
FIG. 5 is a cross-sectional diagram of a step in the formation of an optoelectronic device in accordance with the present principles.

Referring now to FIG. 5, a cross-sectional view of a step in the formation of an optical coupling system 100 is shown. A layer of resin material 502 is formed on the surface of the substrate 102 and the OE chip 106. It is specifically contemplated that the layer of resin material may be formed from the same material as the substrate 102 and may be spun on or deposited by any other appropriate process. In one particular embodiment, resin material may be cured by exposure to ultraviolet light, but it should be understood that any other appropriate material may be used instead.

The resin material 502 is in its uncured state at this stage and is used to fill any gaps that may remain between the OE chip 106 and the sidewalls of the cavity 302. This provides an insulating barrier that prevents subsequent process steps from creating unintended conductive connections to the wiring layers 104. The gap between the OE chip 106 and the sidewalls of the cavity 302 need not be completely filled in an alternative embodiment as long as the opening of the gap at the surface of the substrate 102 is completely covered.

Figure 6:
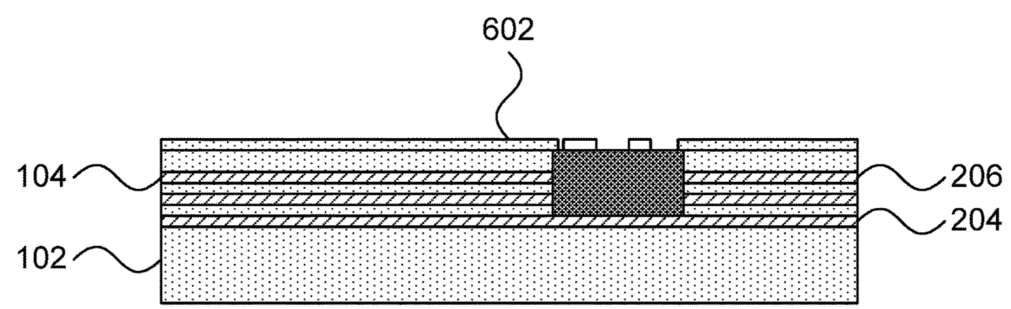
FIG. 6 is a cross-sectional diagram of a step in the formation of an optoelectronic device in accordance with the present principles.

Referring now to FIG. 6, a cross-sectional view of a step in the formation of an optical coupling system 100 is shown. The layer of uncured resin material 502 is masked and cured to form the layer of cured resin material 602. It is specifically contemplated that the mask prevents ultraviolet light from reaching an internal portion of the surface of the OE chip 106, but otherwise leaves the perimeter of the OE chip 106 and the surface of the substrate 102 exposed. The layer of cured resin material 602 forms a seal around the perimeter of the OE chip 106. The unexposed resin material may then be stripped to expose the surface of the OE chip 106.

Figure 7:
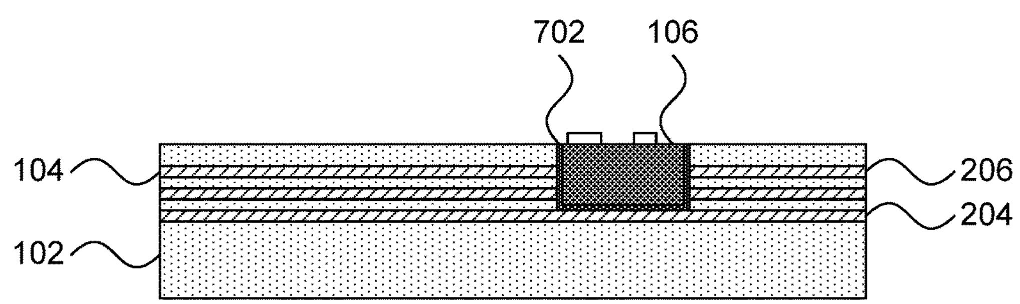
FIG. 7 is a cross-sectional diagram of a step in the formation of an optoelectronic device in accordance with the present principles.

Referring now to FIG. 7, a cross-sectional view of an alternative step in the formation of an optical coupling system 100 is shown. In this embodiment, rather than forming a seal over the OE chip 106, an insulating layer 702 is deposited on the internal surfaces of the cavity 302. The insulating layer 702 prevents unintended electrical contacts from being formed to the wiring layers 104 by covering the sidewalls of the cavity 302. It should be understood that, if the chip has exposed semiconductor layers elsewhere, the seal described above should be used instead of the insulating layer 702. The insulating layer 702 may be formed from any appropriate insulating material including, e.g., a resin material such as may be used for the substrate 102.

Figure 8:
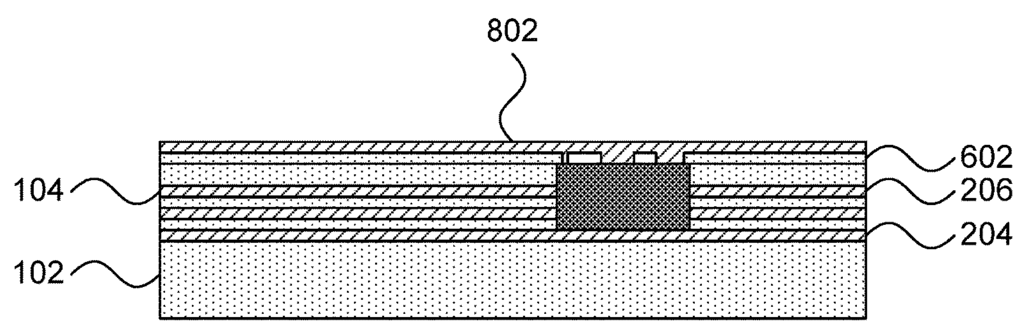
FIG. 8 is a cross-sectional diagram of a step in the formation of an optoelectronic device in accordance with the present principles.

Referring now to FIG. 8, a cross-sectional view of a step in the formation of an optical coupling system 100 is shown. A layer of conductive material 802 is formed by, e.g., electroless plating. It is specifically contemplated that the conductive material may be copper, but it should be understood that any appropriate conductive material may be used instead. It should be noted that the cured resin layer 602 prevents the conductive material from forming in any gaps that may occur between the substrate 102 and the OE chip 106.

Figure 9:
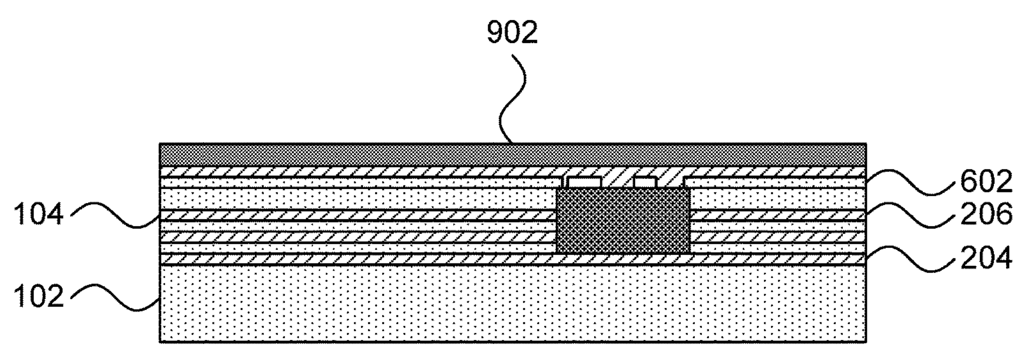
FIG. 9 is a cross-sectional diagram of a step in the formation of an optoelectronic device in accordance with the present principles.

Referring now to FIG. 9, a cross-sectional view of a step in the formation of an optical coupling system 100 is shown. A layer of uncured resin material 902 is formed over the layer of conductive material 802 by, e.g., a spin-on process. It is specifically contemplated that this layer of uncured resin material 902 may be formed from the same resin material as the substrate 102, but it should be understood that any appropriate resin material may be used instead.

Figure 10:
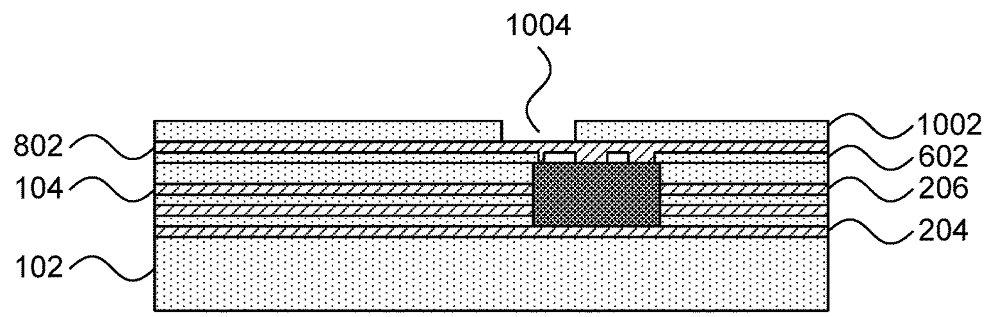
FIG. 10 is a cross-sectional diagram of a step in the formation of an optoelectronic device in accordance with the present principles.

Referring now to FIG. 10, a cross-sectional view of a step in the formation of an optical coupling system 100 is shown. The layer of uncured resin material 902 is masked and cured using, e.g., an ultraviolet light to create cured resin layer 1002 having a gap 1004 directly over the conductive terminals 404 and extending beyond the boundary of the OE chip 106, to a position where the driver chip 108 will be mounted.

Figure 11:
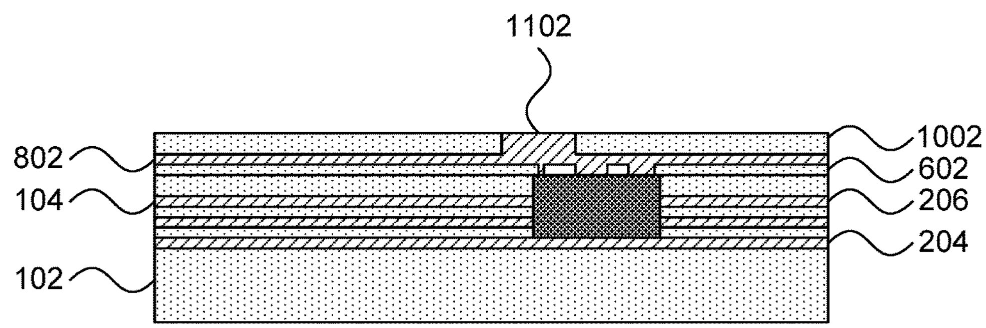
FIG. 11 is a cross-sectional diagram of a step in the formation of an optoelectronic device in accordance with the present principles.

Referring now to FIG. 11, a cross-sectional view of a step in the formation of an optical coupling system 100 is shown. Additional conductive material is formed in the gap 1004 by, e.g., an electroplating process. This forms a thicker region of conductive material 1102 in the region where an interconnect will be formed between the driver chip 108 and the conductive terminal 404 of the OE chip 106.

Figure 12:
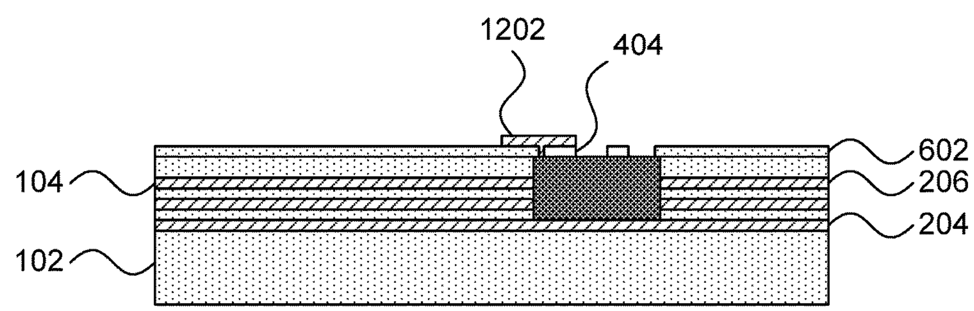
FIG. 12 is a cross-sectional diagram of a step in the formation of an optoelectronic device in accordance with the present principles.

Referring now to FIG. 12, a cross-sectional view of a step in the formation of an optical coupling system 100 is shown. The top layer of cured resin material 1002 is stripped away and the conductive material is uniformly etched to decrease its thickness in, e.g., a timed wet or dry chemical etch or an anisotropic etch such as reactive ion etching. The remaining conductive material 1202 forms an interconnect that is on conductive contact with the conductive terminal 404 of the OE chip 106.

Figure 13:
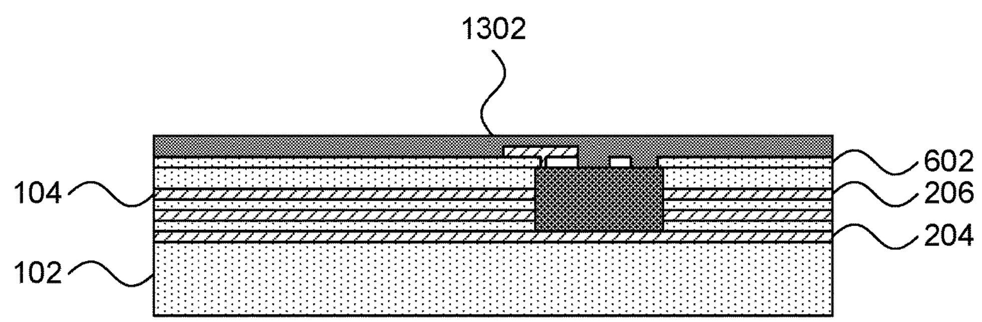
FIG. 13 is a cross-sectional diagram of a step in the formation of an optoelectronic device in accordance with the present principles.

Referring now to FIG. 13, a cross-sectional view of a step in the formation of an optical coupling system 100 is shown. A layer of uncured resin material 1302 is formed over the earlier-cured layer of resin material 602 and over the OE chip 106 and interconnect 1202 by, e.g., a spin-on process. It is specifically contemplated that this layer of uncured resin material 1302 may be formed from the same resin material as the substrate 102, but it should be understood that any appropriate resin material may be used instead.

Figure 14:
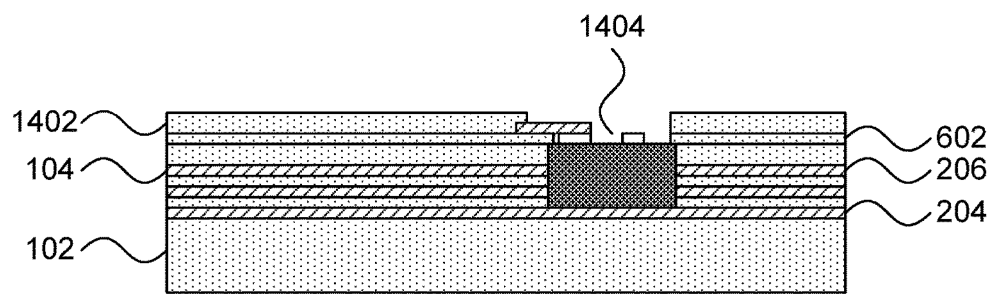
FIG. 14 is a cross-sectional diagram of a step in the formation of an optoelectronic device in accordance with the present principles.

Referring now to FIG. 14, a cross-sectional view of a step in the formation of an optical coupling system 100 is shown. The layer of uncured resin material 1302 is masked and cured using, e.g., an ultraviolet light to create cured resin layer 1402 having a gap 1404 directly over the OE chip 106 and the interconnect 1202, to a position where the driver chip 108 will be mounted.

Figure 15:
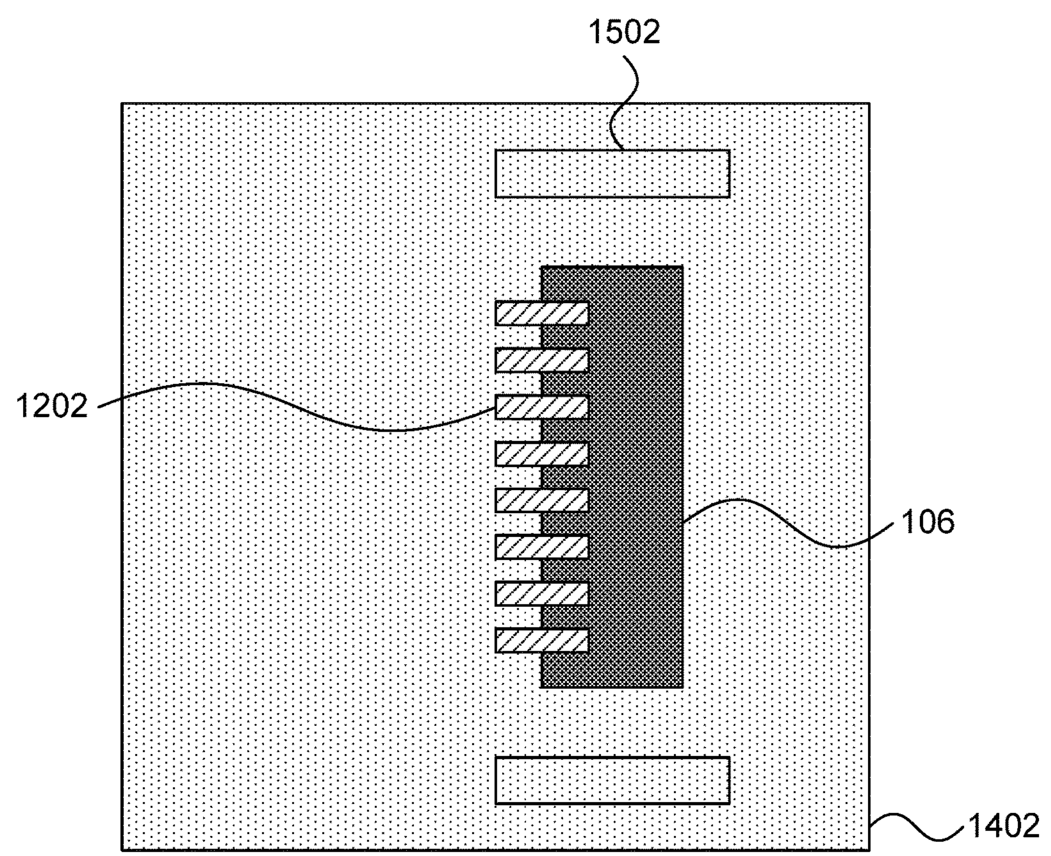
FIG. 15 is a top-down view of a step in the formation of an optoelectronic device in accordance with the present principles.

Referring now to FIG. 15, a top-down view of the step of FIG. 14 is shown. Notably, additional gaps 1502 that were formed during the initial laser ablation (see FIG. 3) are formed at sides of the OE chip 106. These gaps 1502 may be filled or masked during the intervening steps and opened after the formation of the cured resin layer 1402 having the gap 1404. The gaps 1502 are used to position and fasten the lens array 110 to the substrate 102. By using precise ablation to form the gaps 1502 and 302, the relative positioning of the OE chip 106 and the lens array 110 can be precisely set, thereby minimizing coupling losses.

Figure 16:
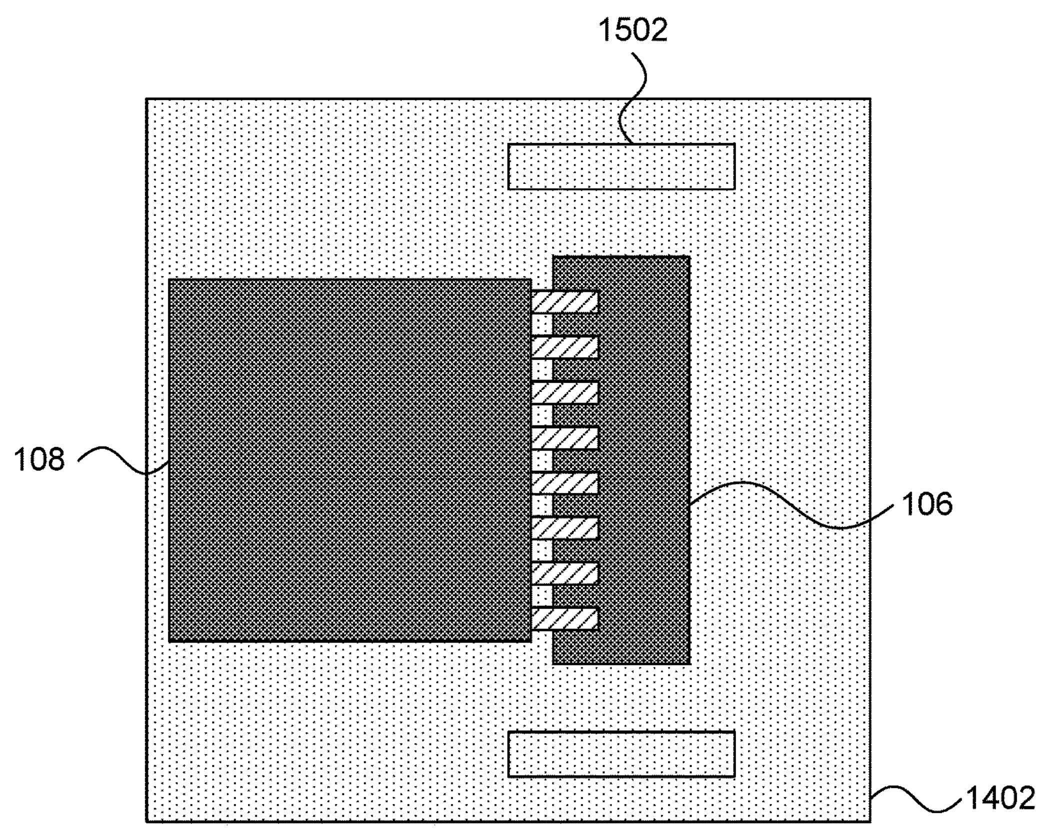
FIG. 16 is a top-down view of a step in the formation of an optoelectronic device in accordance with the present principles.

Referring now to FIG. 16, a top-down view of a step in the formation of an optical coupling system 100 is shown. The driver chip 108 is mounted, with contacts/solder balls 109 being formed in contact with interconnects 1202. It should be understood that, in other embodiments, the driver chip 108 may be mounted with its contacts directly over the conductive terminals 404 of the OE chip 106.

Figure 17:
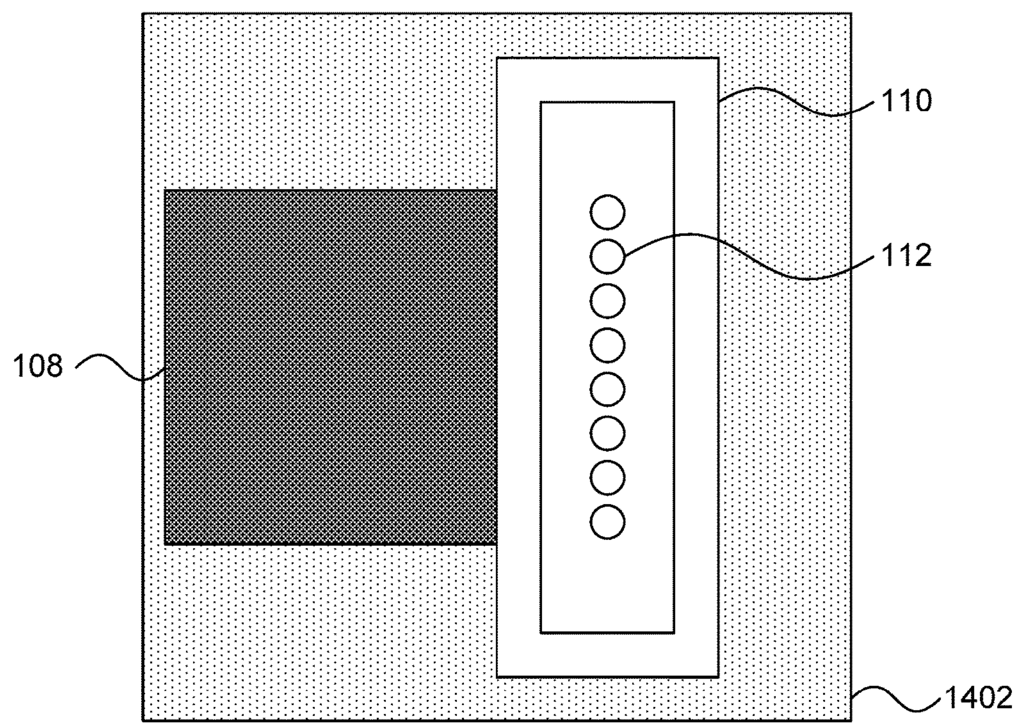
FIG. 17 is a top-down view of a step in the formation of an optoelectronic device in accordance with the present principles.

Referring now to FIG. 17, a top-down view of a step in the formation of an optical coupling system 100 is shown. The lens array 110 is mounted using the gaps 1502, with lenses 112 being positioned over corresponding OE components 402 on the OE chip 106. In contrast to conventional optical multi-chip modules, where OE chips and lens arrays are mounted separately and connected via optical waveguides, the density of optical components can be made significantly higher, for example by omitting waveguides and stacking OE chips 106, driver chips 108, and lens arrays 110 vertically.

In one particular embodiment, optical loss is reduced by about 2.4 dB. For example, about 2 dB loss reduction comes from eliminating four waveguide mirrors at a benefit of about 0.5 dB each, 0.1 dB propagation loss reduction from eliminating the waveguide itself, about 0.1 dB and about 0.2 dB of coupling losses between the waveguide and the VCSEL and between the waveguide and the photodetector respectively. As data rates increase and photodetector diameter decreases, loss can be further decreased by changing the curvature radius and position of the lens array 110.

Figure 18:
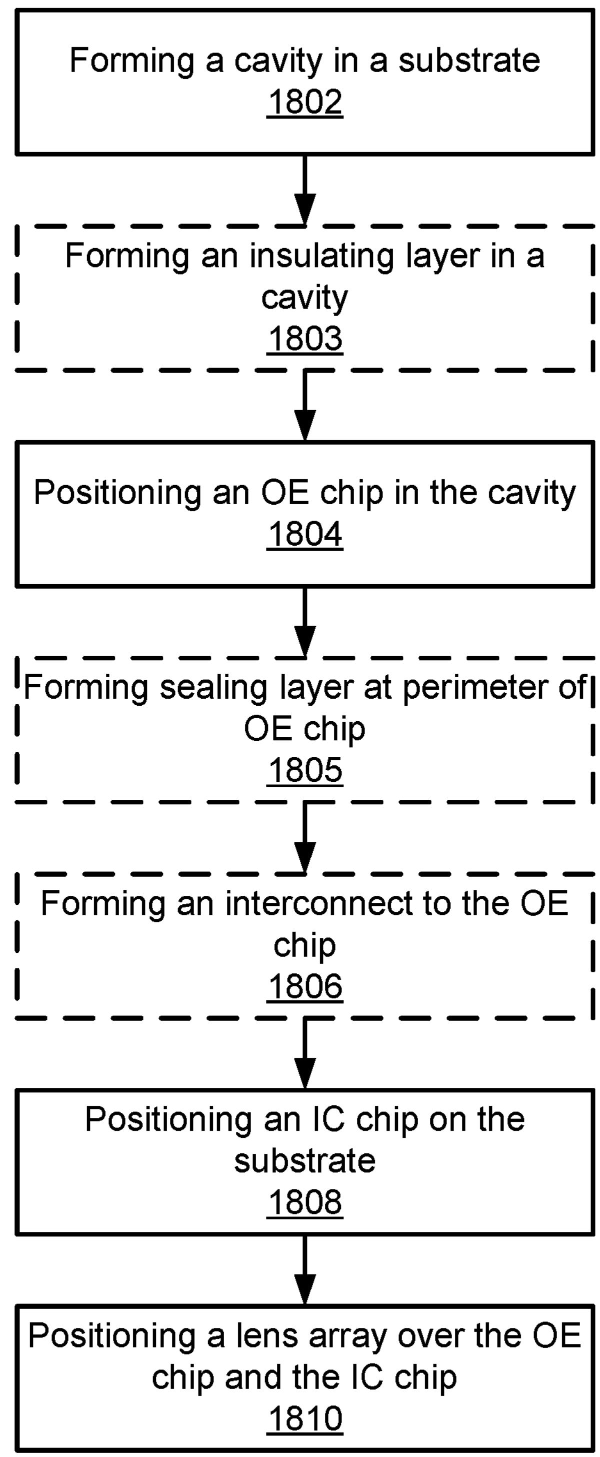
FIG. 18 is a block/flow diagram of a method of forming an optoelectronic device in accordance with the present principles.

Referring now to FIG. 18, a method of forming an optoelectronic device is shown. Block 1802 forms a cavity 302 in a substrate layer 102. As described above, this can be performed using a laser ablation process that stops on wire layers 104 embedded in the substrate layer 102. The wire layers 104 define the horizontal and vertical extent of the cavity 302. Block 1804 positions the optoelectronic chip 106 in the cavity 302.

In one embodiment, block 1803 forms an insulator layer 702 on the interior surface of the cavity 302. In an alternative embodiment, block 1805 forms a sealing layer 602 around a perimeter of the top surface of the optoelectronic chip 106 after the optoelectronic chip 106 is positioned in the cavity 302. The effect of these steps is to seal the wire layers 104 during the formation of interconnects 1202 in block 1806. In an alternative embodiment, the formation of the interconnects 1202 is omitted entirely.

Block 1808 positions the driver chip 108 (or any other appropriate integrated circuit chip) on the substrate 102. In one embodiment, the driver chip 108 is positioned partially overlapping with the optoelectronic chip 106, such that interconnects 1202 are not needed. In another embodiment, the driver chip 108 is offset from the optoelectronic chip 106, with the interconnects 1202 providing electrical communication between the driver chip 108 and the optoelectronic circuit 106.

Block 1810 positions the lens array 110 over the optoelectronic chip 106 and the driver chip 108. This positioning may be aided by additional cavities 1502 that may be formed by block 1802 and that provide a receiving point for a portion of the lens array 110. The lens array 110 rests on the substrate 102 includes a cut-out that accommodates the driver chip 106 without touching the driver chip 106. The lenses 112 of the lens array 110 are positioned directly above respective optoelectronic components 402 of the optoelectronic chip 106.

Having described preferred embodiments of optoelectronic chips embedded in an organic substrate (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An optoelectronic device, comprising:

an optoelectronic chip in a substrate layer, the optoelectronic chip comprising one or more optoelectronic components;

an integrated circuit chip positioned on the substrate layer; and a lens array positioned on the substrate layer above the optoelectronic chip and above at least part of the integrated circuit chip, wherein the lens array comprises one or more lenses positioned directly above said optoelectronic chip and has a cut-out portion that accommodates the integrated circuit chip.

2. The optoelectronic device of claim 1, wherein the lens array does not physically contact the integrated circuit chip.

3. The optoelectronic device of claim 1, further comprising at least one conductive interconnect that provides electrical connection between the integrated circuit chip and the optoelectronic chip.

4. The optoelectronic device of claim 1, wherein the integrated circuit chip is positioned at least partially above the optoelectronic chip and wherein the integrated circuit chip is electrically connected to the optoelectronic chip by a solder ball positioned directly between the integrated circuit chip and the optoelectronic chip.

5. The optoelectronic device of claim 1, wherein the substrate layer comprises an organic substrate material and one or more conductive wire layers embedded in the substrate layer.

6. The optoelectronic device of claim 5, wherein the one or more conductive wire layers define a region of the substrate layer for the optoelectronic chip and one or more lens array positioning regions where a portion of the lens array extends into the substrate layer.

7. The optoelectronic device of claim 6, further comprising an insulating layer formed on sidewalls of the region of the substrate layer for the optoelectronic chip, between the substrate layer and the optoelectronic chip.

8. The optoelectronic device of claim 1, wherein a top surface of the optoelectronic chip is below a top surface of the substrate layer and wherein a perimeter of the top surface of the optoelectronic chip is covered by material of the substrate layer.

9. The optoelectronic device of claim 1, wherein there is no waveguide between the optoelectronic chip and the lens array.

10. A method of forming an optoelectronic device, comprising:

removing material in a substrate layer to form a cavity;

positioning an optoelectronic chip in the cavity;

positioning an integrated circuit chip on the substrate layer in electrical communication with the optoelectronic chip; and positioning a lens array on the substrate layer above the optoelectronic chip and above at least part of the integrated circuit chip, the lens array having a cut-out portion that accommodates the integrated circuit chip.

11. The method of claim 10, wherein the substrate layer comprises an organic substrate material and one or more conductive wire layers embedded in the substrate layer.

12. The method of claim 11, wherein removing material in the substrate layer comprises removing material from the substrate layer with a laser that stops on the one or more conductive wire layers.

13. The method of claim 10, wherein removing material in the substrate layer comprises forming at least three cavities and wherein the optoelectronic chip is positioned in a center cavity.

14. The method of claim 13, wherein positioning the lens array on the substrate layer comprises aligning the lens array with one or more of the at least three cavities in the substrate layer, such that at least a portion of the lens array is positioned within the substrate layer.

15. The method of claim 10, further comprising forming an insulating layer in the cavity before positioning the optoelectronic chip.

16. The method of claim 10, further comprising forming a layer of substrate material over a perimeter of a top surface of the optoelectronic chip.

17. The method of claim 10, wherein positioning the integrated circuit chip on the substrate layer comprises positioning at least a portion of the integrated circuit chip directly above the optoelectronic chip, further comprising forming an electrical connection between the integrated circuit chip and the optoelectronic chip through solder directly between the integrated circuit chip and the optoelectronic chip.

18. The method of claim 10, wherein positioning the integrated circuit chip on the substrate layer comprises positioning the integrated circuit chip such that no part of the integrated circuit chip overlaps the optoelectronic chip.

19. A method of forming an optoelectronic device, comprising:

ablating material in a substrate layer to form a plurality of cavities using a laser that stops on one or more conductive wire layers embedded in the substrate layer;

positioning an optoelectronic chip in one of the plurality of cavities;

positioning an integrated circuit chip on the substrate layer in electrical communication with the optoelectronic chip;

positioning a lens array on the substrate layer above the optoelectronic chip and above at least part of the integrated circuit chip by aligning the lens array with one or more cavities of the plurality of cavities, such that at least a portion of the lens array is positioned within the substrate layer, the lens array having a cut-out portion that accommodates the integrated circuit chip.

* * * * *